United States Patent [19]
Rajsuman et al.

[11] Patent Number: 5,963,566
[45] Date of Patent: Oct. 5, 1999

[54] APPLICATION SPECIFIC INTEGRATED CIRCUIT CHIP AND METHOD OF TESTING SAME

[75] Inventors: Rochit Rajsuman, San Jose; Ching-Yen Ho, Saratoga, both of Calif.

[73] Assignee: LSI Logic Corporation, Milpitas, Calif.

[21] Appl. No.: 08/768,428

[22] Filed: Dec. 18, 1996

[51] Int. Cl.[6] .................................................. G01R 31/28
[52] U.S. Cl. ...................................... 371/22.5; 395/183.06
[58] Field of Search .................................. 371/22.5, 22.4, 371/25.1, 27.1, 27.5, 22.1, 22.6; 395/183.06, 183.07, 183.08, 183.12, 183.2, 185.01, 183.01, 183.13; 365/201

[56] References Cited

U.S. PATENT DOCUMENTS

| | | |
|---|---|---|
| 5,173,906 | 12/1992 | Dreibelbis et al. ................. 371/22.5 |
| 5,515,384 | 5/1996 | Horton, III ....................... 371/22.4 |
| 5,534,774 | 7/1996 | Moore et al. ....................... 324/73.1 |
| 5,537,632 | 7/1996 | Gorshe ........................... 395/183.18 |
| 5,553,082 | 9/1996 | Connor et al. .................... 371/25.1 |
| 5,617,531 | 4/1997 | Crouch et al. ................... 395/183.06 |
| 5,659,551 | 8/1997 | Huott et al. ...................... 371/22.2 |
| 5,661,732 | 8/1997 | Lo et al. .......................... 371/22.2 |
| 5,668,947 | 9/1997 | Batcher ......................... 395/183.06 |
| 5,675,545 | 10/1997 | Madhavan et al. ................. 365/201 |

*Primary Examiner*—Robert W. Beausoliel, Jr.
*Assistant Examiner*—Nadeem Iqbal

[57] ABSTRACT

An application specific integrated circuit having an embedded microprocessor and core including a memory array, self tests at full operational speed utilizing the computational power of the embedded microprocessor for deterministic testing performed by core specific test algorithms implemented in the assembly code of the embedded microprocessor.

15 Claims, 3 Drawing Sheets

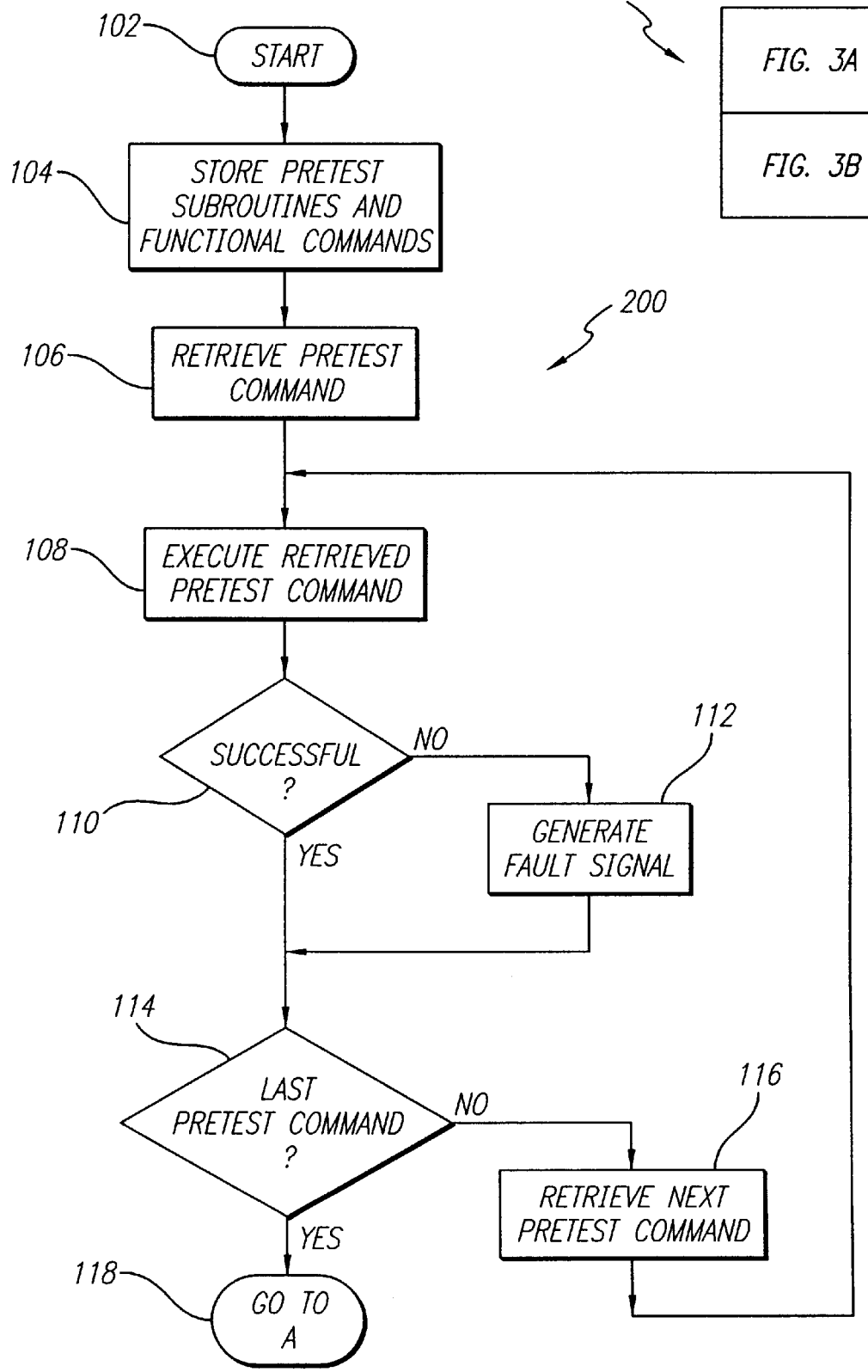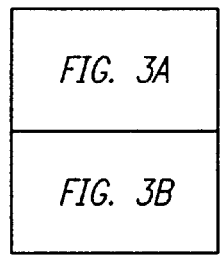

APPLICATION SPECIFIC INTEGRATED CIRCUIT CHIP AND METHOD OF TESTING SAME

1. TECHNICAL FIELD

The present invention relates in general to the manufacture and testing of an application specific integrated circuit chip. The invention more particularly relates to an application specific integrated circuit chip that performs deterministic functional testing using the computation power of a microprocessor embodied on the chip itself.

2. BACKGROUND ART

Application specific integrated circuit (ASIC) chip technology has undergone rapid changes in recent years. In this regard, present day ASIC chips are based on a core concept involving pre-designed models of complex functions that may serve a variety of applications. Thus, an ASIC chip cores in today's technology may well include controllers, interfaces, video circuitry, microprocessors and memory arrays. In short then, an ASIC chip is a system on a chip.

While such integrated circuit chips will have broad applications in emerging technologies, the complexity of such chips is far too complex and different from older integrated circuit technologies to permit such chips to be tested by older testing methodologies. In this regard, there have been several different methodologies for testing previous generation integrated circuit chips. Such methodologies have included IDDQ testing for determining physical chip defects such as bridging; RAMBIST or LRAM vector generation testing for determining memory functionality; full scan testing for verification of synchronous logic operations; and block or partitioning testing for determining mixed analog and digital signals circuits.

Each of the above mentioned methodologies require testing schemes based on random or pseudo-random vectors generated "off chip." In this regard, such testing is typically based on the conventional "line stuck-at-fault" model where test vectors are generated" off chip," applied and collected by means of automatic test equipment (ATE) and then analyzed for correctness by a workstation processing unit that applies specific algorithms and test programs.

While the above mentioned methodologies have been satisfactory for the older integrated circuit technologies, such methodologies are not entirely satisfactory for the highly complex integrated circuit of today. Therefore, it would be highly desirable to have a new and improved integrated circuit chip and method of testing such a chip, that greatly improves manufacturing throughput, substantially reduces manufacturing costs, and significantly reduces design verification time during the development process. Such a new and improved integrated circuit chip and method of testing it should not require the significant use of expensive automated test equipment or workstation processors.

Because of the problems associated with the older testing methodologies, newer testing approaches have been developed. One of the emerging technologies is known as the "built-in self test" or BIST approach. The BIST approach attempts to move certain portions of the semi-conductor test equipment located in the ATE onto the semiconductor base product to be tested. This approach reduces the complexity of the ATE, provides easier access to the embedded memories and other ASIC structures for testing purposes, and permits testing at full operational speeds.

While the BIST approach may be satisfactory for certain application, it is relatively expensive, requires a significant amount of space on the ASIC chip, and requires automated tools for integrating the BIST within the ASIC chip itself. Therefore, it would be highly desirable to have a new and improved ASIC chip that facilitates self testing to greatly reduce overall product development time and that has negligible overhead space on the ASIC chip itself.

DISCLOSURE OF INVENTION

Therefore, the principal object of the present invention is to provide a new and improved integrated circuit chip and method of testing such a chip that greatly improves manufacturing throughput, reduces manufacturing costs, and significantly reduces design verification time during the development process. Such a new and improved integrated circuit chip and testing method should not require the significant use of expensive automated test equipment or workstation processors.

Another object of the present invention is to provide such a new and improved ASIC chip that facilitates self testing to greatly reduce overall product development time and that has negligible overhead space on the ASIC chip itself.

Briefly, the above and further objects of the present invention are realized by providing a new and improved integrated circuit system which is self testing according to a novel testing method of the present invention.

The integrated circuit system includes a general purpose microprocessor and an associated core including a memory array for the storage of a self testing functional verification program. A two pin test interface, and a small embedded test circuit coupled to the microprocessor and the associated core and memory array enable a downloaded functional verification test program to be stored and executed by the on chip microprocessor to facilitate self testing without the need of complex external automatic test equipment and workstation processors.

BRIEF DESCRIPTION OF DRAWINGS

The above-mentioned and other objects and features of this invention, and the manner of attaining them will become apparent, and the invention itself will be best understood by reference to the following description of the embodiments of the invention taken in conjunction with the accompanying drawings, wherein.

BEST MODE FOR CARRYING OUT THE INVENTION

Figure 1:
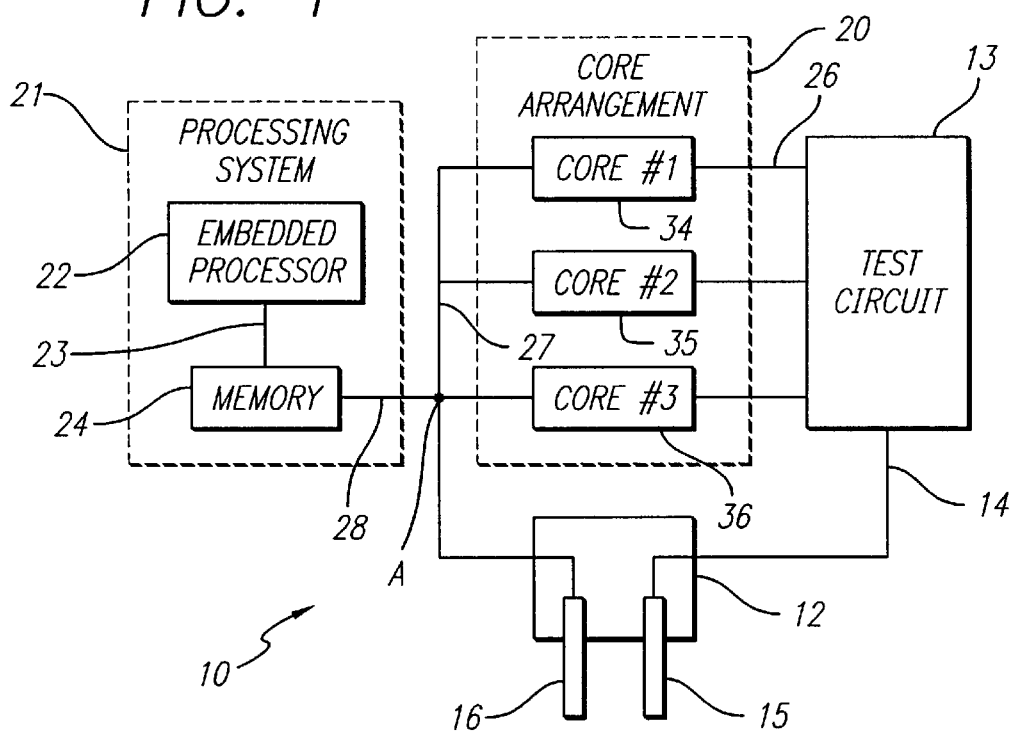
FIG. 1 is a diagrammatic drawing of one embodiment of a self-testing ASIC chip, which is constructed in accordance with the present invention.
Figure 2:
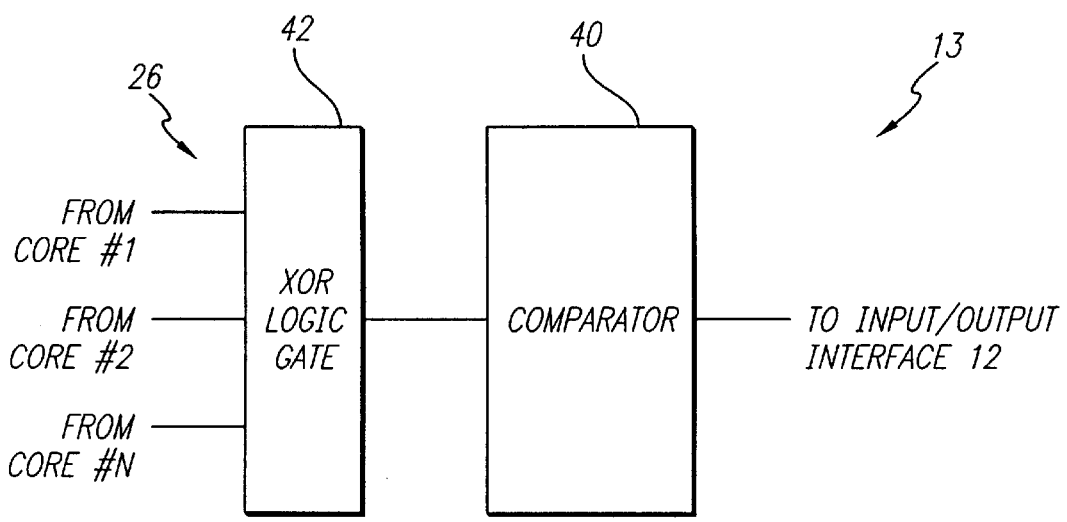
FIG. 2 is a block diagram of an embedded test circuit forming part of the self-testing ASIC chip of FIG. 1.

Referring now to the drawings, and more particularly to FIGS. 1 and 2 thereof, there is shown an application specific integrated circuit (ASIC) chip 10, which is constructed in accordance with the present invention. The ASIC chip 10 can be functionally tested in accordance with the self testing method of the present invention.

The ASIC chip 10 generally comprises a two pin input/output interface structure 12 and an associated test circuit 13. The test circuit 13 includes an output fault detection path 14 which is coupled to an output pin 15 of the two pin interface 12. In this regard, whenever the test circuit 13 detects a functional defect on the chip 10, a fault detection signal will be generated and conducted via the path 14 to the output pin 15 to provide an off chip fault detection signal.

As best seen in FIG. 1, the test circuit 13, is coupled via a core arrangement 20 to a processing system 21 that includes a microprocessor 22 for executing functional test commands, and a memory array 24 for the storage of a test algorithm 100 that will be described hereinafter in greater detail. The test circuit 13 and the processing system 21 are coupled to the core arrangement 20 by a pair of conventional conductive routing paths 26 and 27 respectively.

As best seen in FIG. 1, the core arrangement 20 includes a set of like cores, such as a core 34, a core 35, and a core 36. While the preferred embodiment of the present invention is described as having a set of like cores 34–36, those skilled in the art will understand that the self-testing ASIC chip of the present invention may contain a plurality of different types and kinds of cores, or a single processor core, such as an Ethernet core.

In order to enable the test algorithm 100 to be stored in the memory array 24 for subsequent execution by the microprocessor 22, the interface 12 also includes a command or instruction input pin 16 that is coupled to the processor memory array 24 by another conventional conductive routing path of integrated circuit, such as an instruction input path 28. Conductive paths 27 and 28 are interconnected at a common node A as best seen in FIG. 1.

A processor memory to processor conductive path 23 enables the test algorithm data or information to be transferred between the microprocessor 22 and the processor memory array 24.

Considering now the testing of the ASIC chip 10, an automated test equipment fixture (not shown) receives the chip 10 in such a manner as to enable the test algorithm 100 to be downloaded onto the chip 10 via the input pin 16 and the associated conductive paths 27 and 28. In this regard, the test algorithm 100 is loaded into the memory array 24 and the cores 34–36 respectively during a test mode of operation. Once the memory array 24 and the processor cores 34–36 have been loaded with the test algorithm 100, a self test signal is applied to the input pin 16 to cause the microprocessor 22 to commence execution of the test algorithm 100.

The test algorithm 100 includes an instruction set that is inclusive of all of the operational or functional commands designed into the microprocessor 22, and the associated cores 34–36. Such commands, when retrieved from the memory array 24, should in a functional fault-free chip, be executed by the microprocessor 22 in precisely the same manner relative to each of the cores 34–36. Stated otherwise, if the execution of an instruction command is performed correctly, the microprocessor 22 will perform an intended operation exactly, no more and no less to give a positive indication that there is no functional fault regardless of which one of the processor cores 34–36 is responding to the test information or data. The underlying assumption in such a testing methodology is that a manufacturing fault will not cause the same error in two or more copies of a core on the same die.

This testing methodology is implemented in the test circuit 13 which determines whether a given functional command executed by the microprocessor 22, is executed in precisely the same manner to produce the same results relative to each respective one of the cores 34–36. If the microprocessor 22 does not execute the same given command, relative to each respective one of cores 34–36, in precisely the same manner, the test circuit 13 will generate a fault signal that is transferred via the output fault detection path 14 to the fault detection output pin 15. In this manner, while the chip 10 is operating at full functional speed, a fault detection signal will be generated, whenever a functional fault is detected on the chip 10.

Considering now the test circuit 13 in greater detail with reference to FIG. 2, the test circuit 13 generally includes a comparator 40 for determining whether the functional command results produced by the microprocessor 22 relative to the command information retrieved and processed by each one of the cores 34–36 is precisely the same, nothing more and nothing less.

In order to couple the command output results from each of the respective cores 34–36 to the comparator 40, the test circuit 13 also includes an XOR logic gate tree 42. The logic gate tree 42 enables the comparator 40 to perform a bit-by-bit comparison of the results achieved from the command information processed by each respective one of the cores 34–36.

Considering now the testing methodology in greater detail, in order to determine the correctness of an operation, each instruction in a given instruction set should execute correctly. If the execution of the given instruction performs the intended operation exactly as expected, there is no functional fault associated with the circuitry of the chip 10.

In order to manage the testing of all instructions in the instruction set available to the microprocessor 22, the instruction set is divided into a pre-test group and a continue-testing group of instructions. The pre-test group is a basic group that if executed successfully would give rise to an implied assumption that all remaining instructions; i.e., those included in the continue-testing group will also be executed correctly.

In order to facilitate the two step process, the functional self test routine 100 is divided into a pre-test subroutine 200 and a continue-test subroutine 300. The subroutines 200 and 300 will be discussed hereinafter in greater detail.

The following examples will illustrate the above mentioned two step methodology:

Assumptions:

The basic methodology is to enable the chip 10 to utilize its own internal computation power to execute the test algorithms and procedures on the chip 10 itself. This approach eliminates complex interface requirements and further allows the chip 10 to be tested at its full operating speed.

Considering now a chip, such as the chip 10, having a general purpose microprocessor designed to execute a full set of functional commands such as branch, compare, move, load, read, write, and so forth. The chip further includes a set of general registers, such as a registers $R_i$ and $R_j$ and a set of flags, such as a zero-flag identified as a z-bit.

Procedures:
/* PROCEDURE FOR SELF-TESTING AN ASCI EMBEDDED MICROPROCESSOR*/
 /* Test a minimum set of instructions (Branch, Compare, Move)*/
 /* Incrementally test balance of instructions using pre-test commands that have been successfully executed and tested*/
Considering now the self test routine for four basic commands:
move, conditional branch, unconditional branch, and compare as described hereinafter:

The Move Command:
The move command /*MOV #d, R;
move data d into register R */
The Conditional Branch Command:
The conditional branch command /*BEQ x;
if z-bit set, branch to location x */
The Unconditional Branch Command:
The unconditional branch command /*BRA x;
unconditional branch to location x */
The Compare Command:
The compare command /*CMP $R_i,R_j$;
subtract content of the $R_i$ register from the content of the $R_j$ register, and put results in the $R_j$ register */
Considering now an example of a pre-test self testing subroutine with reference to the four basic commands: move, conditional branch, unconditional branch and compare:

```
/*SELF-TEST FOR PRE-TEST COMMANDS*/
    MOV #0, R1; z-bit should be set to 0
    BEQ a     ; branch to "a" if z-bit did set
    BRA error ; branch to "error" if z-bit did not set
 a: MOV #1, R1; checks z-bit transition 0-1
    BEQ error ; branch to "error" if z-bit still 0,s-a-0
 b: MOV #0, R1; checks z-bit transition 1-0
    BEQ c     ; z-bit made transition
    BRA error ; z-bit is still 1, s-a-1
 c: MOV #1, R2;
    MOV #0, R1; z-bit becomes 0
    CMP R1, R2; compare should reset z-bit,{R2<(R2-R1)}
    BEQ error ; CMP instruction has error, z-bit is
still 0
    CMP R1, R2; BRANCH 5
    BEQ error
    MOV #0, R2; it will agains set z-bit transition 0-1
    CMP R1, R2;
    BEQ d     ;
    BRA error ;
 d: MOV #1, R1;
    MOV #1, R2;
    CMP R1, R2;
    BEQ success
    BRA error
 error:   write error
 success: write success
    /*This test for (1)MOV a, R_i;(2)BEQ a;(3)BRA;(4)CMP
R_i,R_j*/
```

Considering now in still greater detail, the pre-test subroutine example for the read command:

```
/*Test for READ Instruction*/
for all register do {
    MOV d_i, R_i  ; move different data in different
                    registers, MOV was tested earlier
    READ R_i   ;
    READ R_j   ; data in other registers should not
                 change by read operation
                 this is multiple read such as
                 READ D0, READ D1, READ D2 . . .
                 READ D1, READ D0, READ D1, READ
D2 . . .
}
```

Considering now an example of a complete testing subroutine with reference to testing the remaining functional commands executable by the microprocessor on the ASIC chip:

```
/*Test For All Other Instructions*/
for all instructions do {
    load the registers with different data in data-
registers,
        address-registers and stack pointers,
        Execute instruction i which is one register opera-
tion
        Read all registers
        Execute instructions which are two register opera-
tions
        Read all registers
        Execute arithmetic and memory access instructions
        Read all registers
        }
```

In summary then, the above describe methodology illustrates the concept of developing a software testing routine in the assembly language of the chip microprocessor, using the instruction set of the chip microprocessor and executing the testing routine on the embedded microprocessor, such as the microprocessor 22, to test its operation.

From the foregoing those skilled in the art will understand that the above example is of a generic procedure and thus, the example and the invention is not limited to the specific architecture of any one core, such as the core 34, or any specific embedded microprocessor, such as the microprocessor 22.

Figure 3B:
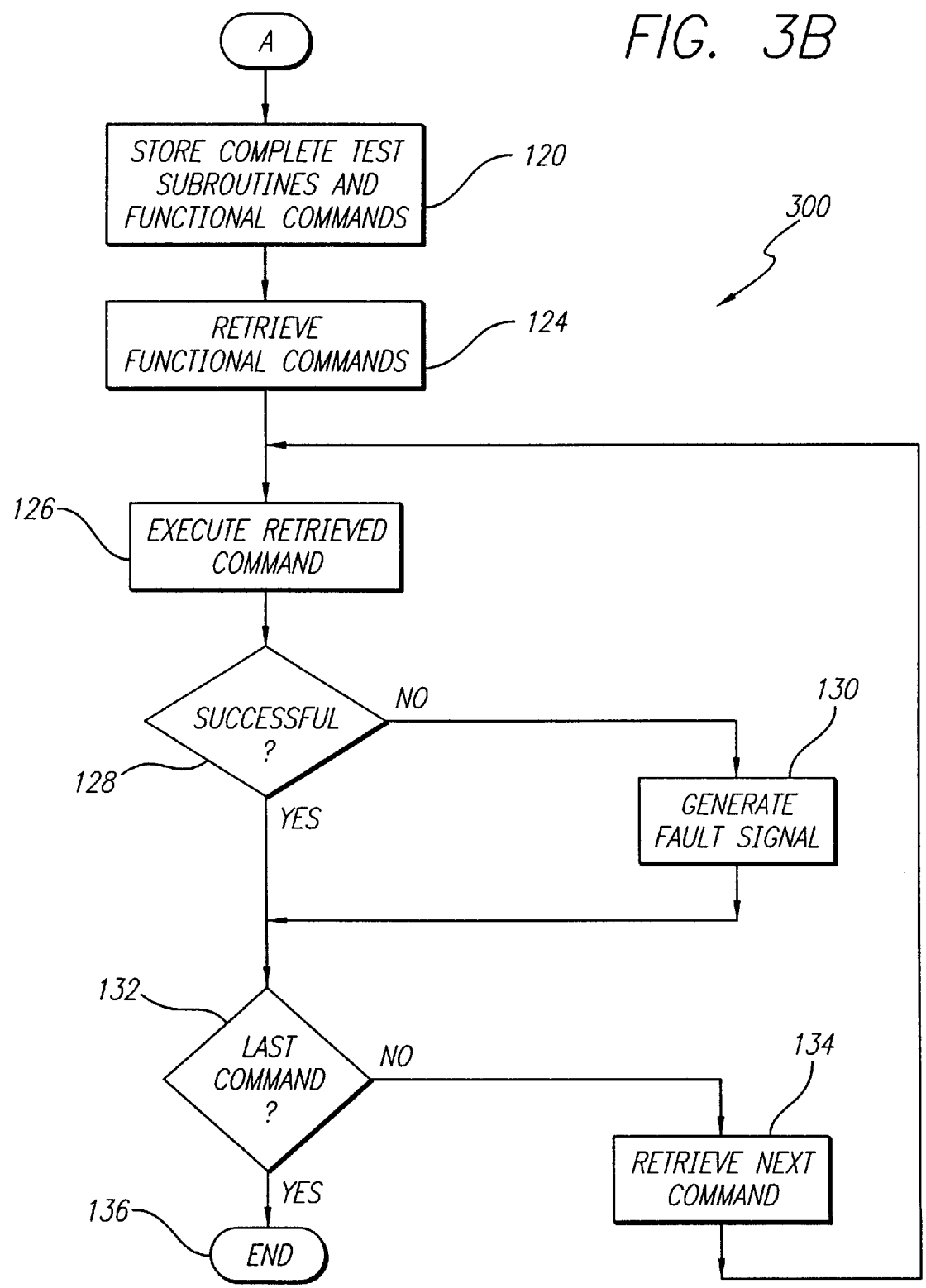
FIG. 3, consisting of 3A & 3B is a flowchart of the operational steps performed by a deterministic functional test program stored in a memory core of the ASIC chip of FIG. 1.

Considering the operational steps resulting from the execution of the self test functional routine 100 in greater detail with reference to FIG. 3, the self testing routine 100 begins at a start download command 102 when the chip 10 has been prepared for testing in the automated test equipment (not shown). In this regard, the download command 102 causes the pre-test subroutine 200 and the pre-test functional commands to be downloaded via the ATE onto the chip 10.

The routine 100 then advances to a store command 104 that causes the downloaded pre-test subroutine 200 and the associated pre-test functional commands to be stored for subsequent retrieval by the microprocessor 22.

Once the store instruction 104 has been executed, the microprocessor 22 causes the pre-test subroutine 200 to commence execution so that the pre-test functional commands are retrieved in seriatim. The individual ones of the pre-test functional commands include for example such commands as the move, conditional branch, unconditional branch, compare, and read commands. In this regard, the self test routine 200 proceeds to a retrieve instruction 106.

From the retrieve command 106 the self test routine advances to an execute instruction 108 that causes the first pretest command to be executed for testing purposes. After the first pre-test command has been executed, a determination is made at a query command 110 whether the intended operation was successfully performed by the system on the chip 10.

If the operation was not performed as intended, the system advances to an instruction command 112 that enables a fault signal to be generated for providing an off chip indication that a functional failure has occurred.

If the operation was performed as intended, the system advances to another query command 114 to determine whether all of the pre-test function commands have been executed for testing purposes. This step is also performed after the generate command at 112 has been executed.

If the pre-test functional testing has not been completed, the subroutine 200 advances to another retrieve instruction 116 that causes the next functional command in the seriatim string to be retrieved for execution and testing purposes. The pre-test subroutine 200 then returns to the execute command 108 and proceeds as described previously.

If the pre-test functional testing has been completed, the subroutine 200 goes to a go to command 118 that enables the continue testing subroutine 300 to be executed. In this regard, at a store command 120 the continue test subroutine 300 and the remaining associated functional commands are loaded for testing purposes.

Next the subroutine 300 causes a retrieve instruction 124 to be executed that cause a single register functional command to be retrieved for execution and testing purposes. From the retrieve instruction 124, the subroutine goes to an execute instruction 126 causing the retrieved functional command to be executed.

After the retrieved single register functional command has been executed, the subroutine 300 advances to an query command 128 which determines whether the functional command accomplished its intended operation, nothing more and nothing less.

If the operation was performed correctly, the subroutine 300 advances to another query instruction 132 to determine whether all of the functional commands implemented in the on chip system have been tested.

If the operation was not performed correctly, the subroutine 300 goes to an instruction command 130 that causes a default signal to be generated. After the default signal is generated the subroutine 300 proceeds to the query instruction 132.

If it is determined at query instruction 132 that all the functional commands have not been tested, the subroutine 300 proceeds to a retrieve command 134 that causes the next functional command to be tested to be retrieved from the memory array 24. The subroutine next advances to the execute command 126 and proceeds as described previously.

If it is determined at query instruction 132 that all of the functional commands have been tested, the subroutine 300 advances to an end command 136 which in turn causes a test completed signal to be generated.

From the foregoing, those skilled in the art will understand that self testing is accomplished at full operational speed utilizing deterministic testing performed by core specific test algorithms implemented in the assembly code of the embedded "on chip" microprocessor 22. Those skilled in the art will further understand that such deterministic testing is accomplished without the use of random or pseudo-random sequences or large high overhead "on chip" self-testing circuits.

Although a specific embodiment of the present invention has been disclosed, there is no intention of limitations to the exact abstract or disclosure herein presented.

We claim:

1. A self testing method for an integrated circuit system having microprocessor means and associated core means including a memory array, comprising:

storing in the memory array computer readable codes indicative of a group of pre-test functional commands executable by the microprocessor means to help facilitate subsequent testing management of all of the functional commands executable by the microprocessor means and the associated core means;

instructing the microprocessor means to retrieve in seriatim, individual ones of the pre-test functional commands to facilitate the separate testing of each one of the functional commands executable by the microprocessor means and the associated core means during a test mode of operation;

instructing the microprocessor means to execute in seriatim each individual one of the pre-test functional commands in a manner that the core means produce the same results if the pre-test functional commands perform their intended function;

comparing said respective core means results to each other generating a default signal whenever the core means results are not the same; and generating a continue testing signal whenever all individual ones of the pre-test functional commands executed by the microprocessor means performed their intended functions correctly.

2. A method of enabling an integrated circuit having microprocessor means and associated core means including a memory array, to subsequently self test other functional commands executable by the microprocessor means and the associated core means in response to said continue testing signal, according to claim 1, comprising:

storing in the memory array computer readable codes indicative of the other functional commands executable by the microprocessor means and the associated core means;

instructing the microprocessor means to retrieve in seriatim, individual ones of the other functional commands to facilitate the separate testing of each one of the other functional commands executable by the microprocessor and the associated core means during said test mode of operation;

instructing the microprocessor means to execute in seriatim each individual one of the other functional commands retrieved from the core means;

instructing the microprocessor means to determine if each individual one of the other functional commands executed by the microprocessor means performed an associated intended function correctly;

generating a default signal whenever an individual one of the other functional commands executed by the microprocessor means failed to perform its associated intended function correctly; and generating a test completed signal whenever all individual ones of the other functional commands executed by the microprocessor means performed their intended functions correctly.

3. A self testing integrated circuit system having microprocessor means and associated core means including a memory array, comprising:

functional test program means responsive during a test mode of operation for causing the microprocessor means to execute in seriatim individual functional commands executable by the integrated circuit system in a manner that the core means produce the same results if the individual functional commands perform their intended function;

fault detection means coupled to the microprocessor means and the associated core means for generating a default signal whenever the core means results are not the same; and interface means coupled to the microprocessor means and said fault detection means for permitting computer readable code means indicative of the functional commands executable by the integrated circuit system to be stored in the memory array and for permitting said default signal to be detected for quality assurance purposes during said test mode of operation.

4. A self testing integrated circuit system according to claim 3, wherein said functional test program means includes pre-test computer readable code means for testing a small set of basic functional commands executable by the microprocessor means to facilitate managing the subsequent testing of all the functional commands executable by the microprocessor means.

5. A self testing integrated circuit system according to claim 4, wherein said functional test program means further includes continue testing computer readable code means for testing all of the functional commands executable by the microprocessor means after the successful testing of said small set of basic functional commands executable by the microprocessor means.

6. A self testing integrated circuit system according to claim 3, wherein said fault detection means includes:

comparator means coupled to said interface means for supplying it with said default signal whenever the microprocessor means and the associated core means fail to perform an intended functional operation correctly during said test mode of operation; and logic means coupled between said comparator means and the microprocessor means and the associated core means for gating functional result signals to said comparator means to facilitate deterministic testing of the functional operations performed by the microprocessor means and the associated core means.

7. A self testing integrated circuit system according to claim 6, wherein the associated core means is a single core.

8. A self testing integrated circuit system according to claim 6, wherein the associated core means includes a plurality of cores.

9. A self testing integrated circuit system according to claim 8, wherein said plurality of cores are like cores.

10. A self testing integrated circuit system according to claim 9, wherein said plurality of core includes at least two different cores.

11. A self testing integrated circuit system according to claim 3 wherein said interface means is a two pin interface.

12. A self testing integrated circuit system according to claim 11, wherein said two pin interface includes an input pin for receiving said pre-test computer readable code means to permit the microprocessor means to utilize its own computational power to initially verify the correct functional operation of the small set of basic functional commands.

13. A self testing integrated circuit system according to claim 12, wherein said two pin interface further includes an output pin for permitting said default signal to be detected for quality assurance purposes during said test mode of operation.

14. A self testing integrated circuit system according to claim 6, wherein said logic means is XOR gate logic coupled between the comparator means and the core means.

15. A method of testing an integrated circuit system having at least a microprocessor and associated cores including a memory array, comprising:

storing in the memory array computer readable codes indicative of functional commands executable by the microprocessor and the associated cores;

instructing the microprocessor to retrieve in seriatim individual ones of the functional commands executable by the microprocessor and the associated cores;

instructing the microprocessor to execute in seriatim each individual one of the retrieved functional commands in a manner that the associated cores produce the same results if the functional commands perform their intended function; and generating a default signal whenever the associated core means results are not the same.

* * * * *